United States Patent

[11] 3,581,226

[72] Inventors Carroll R. Perkins
Balboa Island;
Everett L. Shaffstall, Fountain Valley;
James L. Gundersen, Wilmington; Robert
N. Yoder, Huntington Beach, all of, Calif.
[21] Appl. No. 886,924
[22] Filed Dec. 22, 1969
[45] Patented May 25, 1971
[73] Assignee Hughes Aircraft Company
Culver City, Calif.

[54] DIFFERENTIAL AMPLIFIER CIRCUIT USING FIELD EFFECT TRANSISTORS
4 Claims, 1 Drawing Fig.

[52] U.S. Cl. .......... 330/30, 330/35
[51] Int. Cl. .......... H03f 3/68
[50] Field of Search .......... 307/279, 304; 330/30, 30 D, 35

[56] References Cited
UNITED STATES PATENTS
3,434,068 3/1969 Sevin .......... 330/35X
3,449,686 6/1969 Bladen .......... 330/35X

*Primary Examiner*—Roy Lake
*Assistant Examiner*—Lawrence J. Dahl
*Attorneys*—James K. Haskell and Paul M. Coble

ABSTRACT: Complementary waveform signals are amplified in respective channels of a dual channel differential amplifier, each channel including a plurality of cascaded field effect transistors. A field effect transistor biased to saturation furnishes an essentially constant current to the first transistor of each channel. A push-pull arrangement including a pair of series connected field effect transistors is provided at the output of each channel. The entire circuit may be fabricated on a single semiconductor substrate using MOS technology.

PATENTED MAY 25 1971
3,581,226
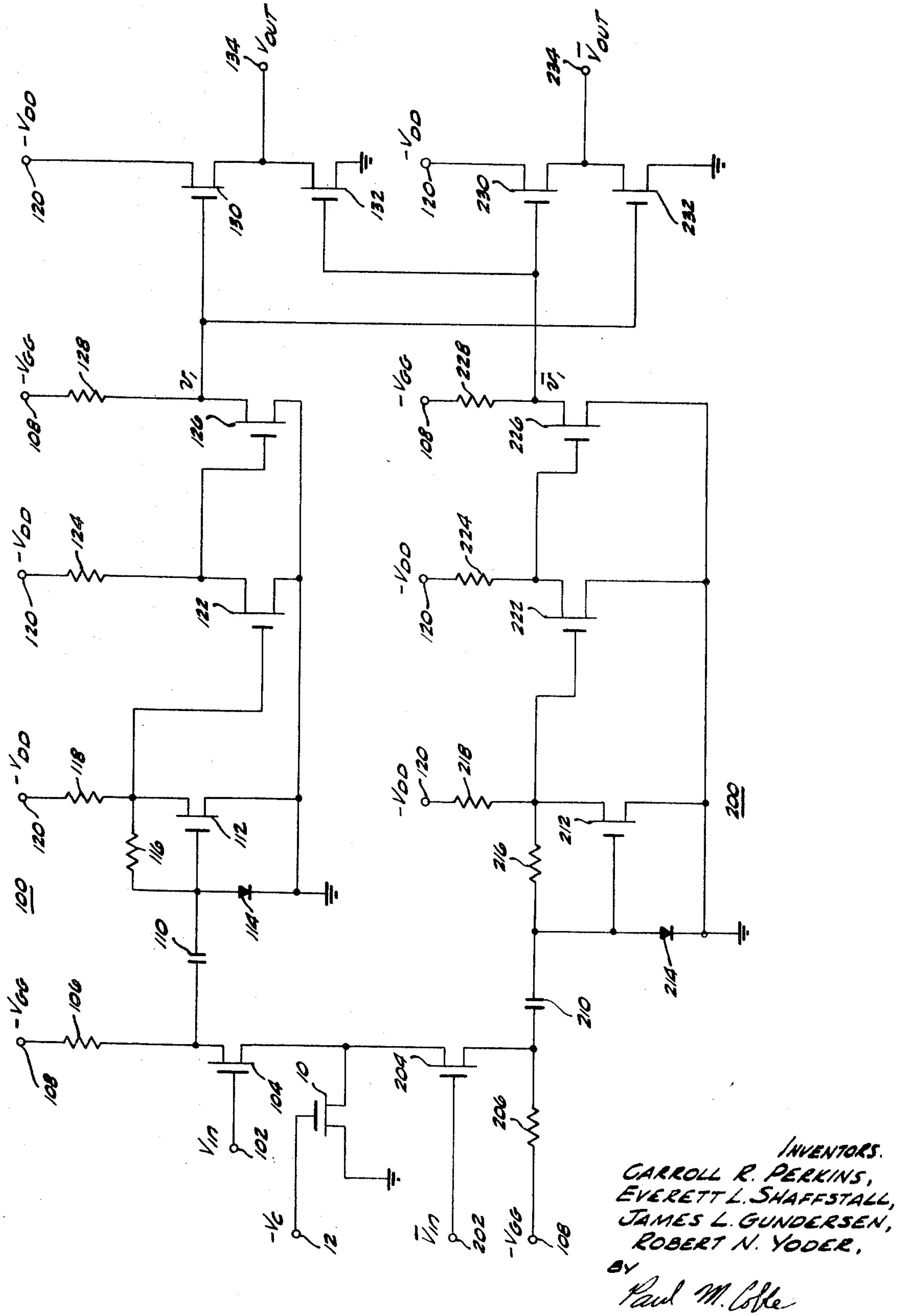
INVENTORS.
CARROLL R. PERKINS,
EVERETT L. SHAFFSTALL,
JAMES L. GUNDERSEN,
ROBERT N. YODER,
BY
Paul M. Coble
ATTORNEY.

DIFFERENTIAL AMPLIFIER CIRCUIT USING FIELD EFFECT TRANSISTORS

This invention relates to electronic circuits, and more particularly relates to a dual channel differential amplifier using field effect transistors for amplifying a pair of signals having complementary waveforms.

Recent advances in microelectronics, including the development of MOS (metal-oxide-semiconductor) devices, have led to new approaches to the design and fabrication of various types of electronic circuits. Specifically, it is often desired to fabricate a complete integrated circuit or system on a single semiconductor substrate, as well as to be able to drive all of the circuit or system components with voltage levels provided by integrated circuitry.

Accordingly, it is an object of the present invention to provide a differential amplifier circuit which is more compatible with integrated electronic circuitry than has been achieved in the prior art.

It is a further object of the present invention to provide a differential amplifier which can be formed entirely on a single semiconductor substrate, or even on only a small portion of such a substrate, and which amplifier is readily operable with voltage levels provided by integrated circuitry.

It is still a further object of the invention to provide a differential amplifier circuit of extremely small size and weight, and which circuit is also relatively insensitive to wide temperature changes.

It is yet another object of the invention to provide a differential amplifier which is operable to simultaneously amplify a pair of signals having complementary waveforms.

These and other objects and advantages of the invention are accomplished by a differential amplifier circuit which comprises two like signal processing channels, each channel including first and second field effect transistors coupled in cascade. Each field effect transistor has a first electrode, a second electrode, and a control electrode. In each channel a capacitance is provided between the second electrode of the first field effect transistor and the control electrode of the second field effect transistor, while a unidirectionally conductive path is provided between the control and first electrodes of the second field effect transistor. A first input signal is applied to the control electrode of the first transistor of the first channel, while a second input signal having a waveform complementary to that of the first input signal is applied to the control electrode of the first transistor of the second channel, an essentially constant current being supplied to the first electrodes of each of the first transistors. Output circuitry coupled to the second electrodes of each of the second field effect transistors provides respective complementary waveform output signals from the first and second channels.

The invention will be described in greater detail with reference to the accompanying drawing in which the sole FIGURE is a schematic circuit diagram illustrating a differential amplifier according to the invention.

Referring to the FIGURE with greater particularity, a differential amplifier circuit according to the invention may be seemed to comprise first and second like signal processing channels 100 and 200, respectively. Since the various circuit components of each channel are the same as corresponding components in the other channel, the corresponding components are designated by the same second and third reference numeral digits, components in the channel 100 bearing a first reference numeral digit "1" and components in the channel 200 being identified by a first reference numeral digit "2".

A first input voltage $v_{in}$ (as measured with respect to a level of reference potential illustrated as ground) is applied to input terminal 102 of channel 100, while a second input voltage $\bar{v}_{in}$ having a waveform complementary to that of the input voltage $v_{in}$ is applied to input terminal 202 of the channel 200. By complementary waveform, it is meant that when the waveform of the voltage $v_{in}$ changes in a positive direction, the waveform of the voltage $\bar{v}_{in}$ changes by the same amount in the negative direction, and vice versa. The input voltages $v_{in}$ and $\bar{v}_{in}$ may be of any desired waveform, including for example, square waves, sinusoidal waves, sawtooth waves, etc. However, since amplitude limiting may occur in the event the input signal amplitude is sufficiently large, the circuit is especially suitable for amplifying small amplitude voltages.

Input terminal 102 is connected to the gate electrode of a field effect transistor 104, which is preferably a metal-oxide-semiconductor field effect transistor (MOSFET), the source electrode of transistor 104 being connected to the source electrode of corresponding transistor 204 in channel 200. An essentially constant current is furnished to the transistors 104 and 204 by means of a current furnishing field effect transistor 10, also preferably a MOSFET, having its drain-source path connected between the interconnected source electrodes of the transistors 104 and 204 and the ground level. The transistor 10 is preferably biased to a saturated conductive condition by applying an appropriate voltage $-V_c$ provided at power supply terminal 12 to the gate electrode of transistor 10. The voltage $-V_c$ may be $-7$ volts, for example.

The drain electrode of transistor 104 is coupled through a resistor 106 to a power supply terminal 108 furnishing a potential $-V_{GG}$ which may be $-26$ volts, for example. The drain electrode of transistor 104 is also coupled through a DC blocking capacitor 110 to the gate electrode of a field effect transistor 112, also preferably a MOSFET, having its source electrode connected to ground. A unidirectionally conductive path is provided between the gate and source electrodes of transistor 112 by means of a clamping diode 114 having its anode connected to the gate electrode and its cathode connected to the source electrode of transistor 112. A bias resistor 116 is connected between the gate and drain electrodes of transistor 112, while the drain electrode of transistor 112 is coupled via a load resistor 118 to a power supply terminal 120 furnishing a potential $-V_{DD}$ which may be $-13$ volts, for example.

The drain electrode of transistor 112 is also coupled to the gate electrode of a further field effect transistor 122, also preferably a MOSFET. The source electrode of transistor 122 is returned to ground, and the drain electrode is coupled through a resistor 124 to power supply terminal 120. The drain electrode of transistor 122 is also coupled to the gate electrode of still another field effect transistor 126, which is also preferably a MOSFET. The source electrode of transistor 126 is returned to ground, while the drain electrode is coupled via a resistor 128 to power supply terminal 108.

In order to provide symmetrical rise and fall times for the output voltage waveforms, in a preferred embodiment of the invention push-pull circuitry, including a pair of series connected field effect transistors, is provided for each signal processing channel. Specifically, in the channel 100 a field effect transistor 130, preferably a MOSFET, has its drain electrode connected to power supply terminal 120 and its source electrode connected to the drain electrode of another field effect transistor 132, also preferably a MOSFET, having its source electrode connected to ground. The gate electrode of transistor 130 is connected to the drain electrode of transistor 126 of channel 100, while the gate electrode of transistor 132 is connected to the drain electrode of transistor 226 of channel 200. The output voltage $v_{out}$ from the channel 100 may be obtained at output terminal 134 connected to the interconnected source and drain electrodes of the transistors 130 and 132, respectively.

As indicated above, the arrangement of circuit components in the channel 200 is the same as that in the channel 100; hence channel 200 will not be described in detail. Note, however, that the gate electrode of push-pull arrangement transistor 232 of the channel 200 is connected to the drain electrode of transistor 126 of the channel 100. The output voltage from the channel 200 is designated $\bar{v}_{out}$ and has a waveform complementary to that of the voltage $v_{out}$ from the channel 100.

In the operation of the circuit, the input voltage $v_{in}$ is amplified by transistor 104. The DC component of the voltage at the drain electrode of transistor 104, developed across resistor 106 due to the voltage $-V_{GG}$ is blocked by the capacitor 110. The DC component of the voltage at the gate electrode of transistor 112 is clamped to essentially ground potential by the diode 114, insuring that that the AC component of this voltage will be negative with respect to ground. The voltage at the gate electrode of the transistor 112 is amplified by transistor 112, and further amplification is provided by transistors 122 and 126. When the amplitude of the input voltage $v_{rin}$ is sufficiently large so that the peak-to-peak excursion of the voltage at the gate electrode of the transistor 112 is greater in magnitude than the threshold voltage $v_{th}$ for the transistor 112, the transistor 112 will be switched between conduction and nonconduction as the threshold voltage is traversed. When the transistor 112 is sufficiently conductive of current, transistor 122 is nonconductive and transistor 126 is conductive, and vice versa should the transistor 112 be nonconductive.

The input voltage $\bar{v}_{in}$ is processed in the channel 200 in the same manner as that described above with respect to the processing of the voltage $v_{in}$ in the channel 100, producing at the drain electrode of transistor 226 a voltage $\bar{v}_1$ which has a waveform complementary to that of the voltage $v_{r1}$ provided at the drain electrode of transistor 126 of channel 100. When the voltage $v_1$ changes in a positive direction, current flow through transistor 130 is decreased, and the magnitude of the voltage across transistor 130 increases. However, since the voltage $\bar{v}_1$ changes in a negative direction at this time, current flow through the transistor 132 increases, while the magnitude of the voltage across transistor 132 decreases. As a result, the magnitude of the output voltage $v_{out}$ at terminal 134 decreases. In addition, a change in the voltage $v_1$ in a positive direction decreases the current flow through transistor 232, increasing the magnitude of the voltage across transistor 132; while the corresponding negative directional change in the voltage $\bar{v}_1$ increases the current flow through transistor 230, decreasing the magnitude of the voltage across transistor 230. Thus, the magnitude of the voltage $\bar{v}_{out}$ at terminal 234 increases. Changes in the voltages $v_1$ and $\bar{v}_1$ in directions opposite to that described above produce corresponding opposite changes in the output voltages $v_{out}$ and $\bar{v}_{out}$.

All of the components of a differential amplifier circuit according to the invention (including the field effect transistors, the resistors, the capacitors, the diodes and the interconnecting circuitry) may be fabricated on a single semiconductor substrate using MOS (metal-oxide-semiconductor) technology. Hence, the present invention is able to provide a differential amplifier of extremely small size and weight, and which is highly compatible with integrated electronic circuitry.

It should be apparent that numerous variations may be made in the differential amplifier circuit specifically shown and described herein. For example, the circuit is disclosed as being operable with negative supply voltages, which are suitable for P-channel field effect transistors (i.e. devices with P-type source and drain regions in an N-type semiconductor substrate); however, N-channel field effect transistors are also suitable, in which case positive supply voltages would be employed.

Thus, while the invention has been shown and described with reference to a particular embodiment, nevertheless various changes and modifications obvious to a person skilled in the art to which the invention pertains are deemed to lie within the spirit, scope and contemplation of the invention.

What we claim is:

1. A differential amplifier circuit comprising:

first and second like signal processing channels, each channel including: first and second field effect transistors coupled in cascade and each field effect transistor having a first electrode, a second electrode, and a control electrode; means for providing a capacitance between the second electrode of said first field effect transistor and the control electrode of said second field effect transistor; and means for providing a unidirectionally conductive path between the control electrode and the first electrode of said second field effect transistor;

means for applying a first input signal to the control electrode of said first field effect transistor of said first channel; means for applying a second input signal having a waveform complementary to that of said first input signal to the control electrode of said first field effect transistor of said second channel;

means for furnishing operating potentials for each of said field effect transistors and including means for supplying an essentially constant current to the first electrodes of each of said first field effect transistors; and output circuit means coupled to the second electrodes of each of said second field effect transistors for providing a first output signal from said first channel and a second output signal from said second channel, said first and second output signals having waveforms complementary to one another.

2. A differential amplifier circuit according to claim 1 wherein said means for furnishing operating potentials includes a source of potential having a first terminal and a second terminal; and said means for supplying an essentially constant current includes a field effect transistor having a first electrode coupled to said first terminal, a control electrode coupled to said second terminal, and a second electrode coupled to the first electrodes of each of said first field effect transistors.

3. A differential amplifier circuit according to claim 1 wherein said output circuit means comprises:

first and second push-pull arrangement field effect transistors each having a first electrode, a second electrode, and a control electrode; the first electrode of said first push-pull transistor being coupled to one terminal of said operating potential furnishing means; the second electrode of said first push-pull transistor being coupled to the first electrode of said second push-pull transistor; the second electrode of said second push-pull transistor being coupled to another terminal of said operating potential furnishing means; the control electrode of said first push-pull transistor being coupled to the second electrode of said second field effect transistor of said second channel; the control electrode of said second push-pull transistor being coupled to the second electrode of said second field effect transistor of said first channel; a first output terminal coupled to the second electrode of said first push-pull transistor;

third and fourth push-pull arrangement field effect transistors each having a first electrode, a second electrode, and a control electrode; the first electrode of said third push-pull transistor being coupled to said one terminal of said operating potential furnishing means; the second electrode of said third push-pull transistor being coupled to the first electrode of said fourth push-pull transistor; the second electrode of said fourth push-pull transistor being coupled to said another terminal of said operating potential furnishing means; the control electrode of said third push-pull transistor being coupled to the second electrode of said second field effect transistor of said first channel; the control electrode of said fourth push-pull transistor being coupled to the second electrode of said second field effect transistor of said second channel; and a second output terminal coupled to the second electrode of said third push-pull transistor.

4. A differential amplifier circuit comprising:

first and second like signal processing channels, each channel including: first, second, third, fourth, fifth, and sixth field effect transistors, each field effect transistor having a first electrode, a second electrode, and a control electrode; first, second, third, and fourth resistors each having one terminal coupled to the respective second electrodes of said first, second, third, and fourth field effect transistors; a capacitor coupled between the second electrode of said first transistor and the control electrode of said second transistor; a diode coupled between the control and first electrodes of said second transistor; a fifth resistor coupled between the control and second electrodes of said second transistor; the second electrode of said second transistor being coupled to the control electrode of said third transistor; the second electrode of said third transistor being coupled to the control electrode of said fourth transistor; the second electrode of said fourth transistor being coupled to the control electrode of said fifth transistor; the first electrode of said fifth transistor being coupled to the second electrode of said sixth transistor; and the control electrode of said sixth transistor being coupled to the second electrode of the said fourth transistor of the other channel;

a source of potential having a first terminal, a second terminal, a third terminal, and a fourth terminal; said first terminal being coupled to the respective first electrodes of said second, third, fourth, and sixth transistors of each channel; said third terminal being coupled to another terminal of said second and third resistors of each channel and to the second electrode of said fifth transistor of each channel; said fourth terminal being coupled to another terminal of said first and fourth resistors of each channel;

a field effect transistor having a first electrode coupled to said first terminal, a control electrode coupled to said second terminal, and a second electrode coupled to the first electrode of said first transistor of each channel;

means for applying a first input signal between the control electrode of said first transistor of said first channel and said first terminal;

means for applying a second input signal having a waveform complementary to that of said first input signal between the control electrode of said first transistor of said second channel and said first terminal; and means for obtaining respective channel output signals between the second electrode of said sixth transistor of each channel and said first terminal.